United States Patent
Lin et al.

(10) Patent No.: US 8,775,982 B2
(45) Date of Patent: *Jul. 8, 2014

(54) OPTICAL PROXIMITY CORRECTION FOR ACTIVE REGION DESIGN LAYOUT

(71) Applicant: Taiwan Semiconductor Manufacturing Company, Ltd., Hsinchu (TW)

(72) Inventors: Mei-Hsuan Lin, Tainan (TW);
Chih-Chan Lu, Kaohsiung (TW);
Chih-Hsun Lin, Tainan (TW);
Chih-Kang Chao, Tainan (TW);
Ling-Sung Wang, Tainan (TW);
Jen-Pan Wang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/926,284

(22) Filed: Jun. 25, 2013

(65) Prior Publication Data

US 2013/0285194 A1      Oct. 31, 2013

Related U.S. Application Data

(63) Continuation-in-part of application No. 13/233,453, filed on Sep. 15, 2011, now Pat. No. 8,533,639.

(51) Int. Cl.
| | |
|---|---|
| *G06F 17/50* | (2006.01) |
| *H01L 25/00* | (2006.01) |
| *H01L 29/788* | (2006.01) |
| *H01L 27/12* | (2006.01) |
| *H03K 19/00* | (2006.01) |

(52) U.S. Cl.
CPC ............ *G06F 17/5072* (2013.01); *H01L 25/00* (2013.01); *H01L 29/788* (2013.01); *H01L 27/12* (2013.01); *H03K 19/00* (2013.01)
USPC ............... 716/53; 716/54; 716/55; 716/111; 716/122; 716/132; 326/41; 326/47; 326/101; 257/316; 257/379; 257/350

(58) Field of Classification Search
CPC ... G06F 17/5072; H01L 25/00; H01L 29/788; H01L 27/12; H03K 19/00
USPC .......... 716/53, 54, 55, 111, 122, 132; 326/41, 326/47, 101; 257/316, 379, 350
See application file for complete search history.

(56) References Cited

U.S. PATENT DOCUMENTS

| 5,457,064 A | 10/1995 | Lee |
| 6,578,177 B2 | 6/2003 | Wu et al. |

(Continued)

FOREIGN PATENT DOCUMENTS

| EP | 1049160 | 11/2000 |
| JP | 2008166691 | 7/2008 |
| KR | 2006008430 | 1/2006 |

*Primary Examiner* — Phallaka Kik
(74) *Attorney, Agent, or Firm* — Haynes and Boone, LLP

(57) ABSTRACT

The present disclosure provides an integrated circuit design method. In an example, a method includes receiving an integrated circuit design layout that includes an active region feature, a contact feature, and an isolation feature, wherein a portion of the active region feature is disposed between the contact feature and the isolation feature; determining whether a thickness of the portion of the active region feature disposed between the contact feature and the isolation feature is less than a threshold value; and modifying the integrated circuit design layout if the thickness is less than the threshold value, wherein the modifying includes adding a supplementary active region feature adjacent to the portion of the active region feature disposed between the contact feature and the isolation feature.

20 Claims, 7 Drawing Sheets

(56) References Cited

U.S. PATENT DOCUMENTS

| | | | |
|---|---|---|---|
| 6,807,662 B2 * | 10/2004 | Toublan et al. | 430/5 |
| 7,250,351 B2 * | 7/2007 | Furukawa et al. | 438/423 |
| 7,386,821 B2 | 6/2008 | Higman et al. | |
| 7,480,604 B2 | 1/2009 | Bianchi | |
| 7,562,327 B2 | 7/2009 | Sekido et al. | |
| 7,767,521 B2 | 8/2010 | Baek | |
| 8,103,977 B2 | 1/2012 | Taoka et al. | |
| 8,425,272 B2 * | 4/2013 | Halls et al. | 445/25 |
| 8,431,985 B2 * | 4/2013 | Hou et al. | 257/327 |
| 8,458,627 B2 * | 6/2013 | Taoka et al. | 716/55 |
| 8,472,228 B2 * | 6/2013 | Deng et al. | 365/51 |
| 8,472,229 B2 * | 6/2013 | Deng et al. | 365/51 |
| 2002/0047165 A1 | 4/2002 | Casper et al. | |
| 2003/0033579 A1 | 2/2003 | Wu et al. | |
| 2004/0018434 A1 | 1/2004 | Tamada | |
| 2005/0263828 A1 | 12/2005 | Ke et al. | |
| 2006/0183265 A1 | 8/2006 | Oh et al. | |
| 2006/0226472 A1 | 10/2006 | Baek | |
| 2007/0082442 A1 | 4/2007 | Kim | |
| 2008/0005717 A1 | 1/2008 | Higman et al. | |
| 2008/0157800 A1 | 7/2008 | Hong | |
| 2009/0176361 A1 | 7/2009 | Park | |
| 2009/0267124 A1 | 10/2009 | Bosshard | |
| 2010/0314712 A1 | 12/2010 | Arai et al. | |
| 2011/0117714 A1 | 5/2011 | Levy et al. | |
| 2011/0316084 A1 | 12/2011 | Anderson et al. | |
| 2012/0096416 A1 | 4/2012 | Hutchens et al. | |
| 2012/0106225 A1 | 5/2012 | Deng et al. | |
| 2013/0059238 A1 | 3/2013 | Kurjanowicz | |
| 2013/0069162 A1 * | 3/2013 | Lin et al. | 257/368 |

* cited by examiner

OPTICAL PROXIMITY CORRECTION FOR ACTIVE REGION DESIGN LAYOUT

CROSS REFERENCE

This application is a continuation-in-part (CIP) and claims the benefit of U.S. patent application No. 13/233,453, filed on Sep. 15, 2011, entitled "Optical Proximity Correction for Active Region Design Layout," the entire disclosure of which is incorporated herein by reference.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
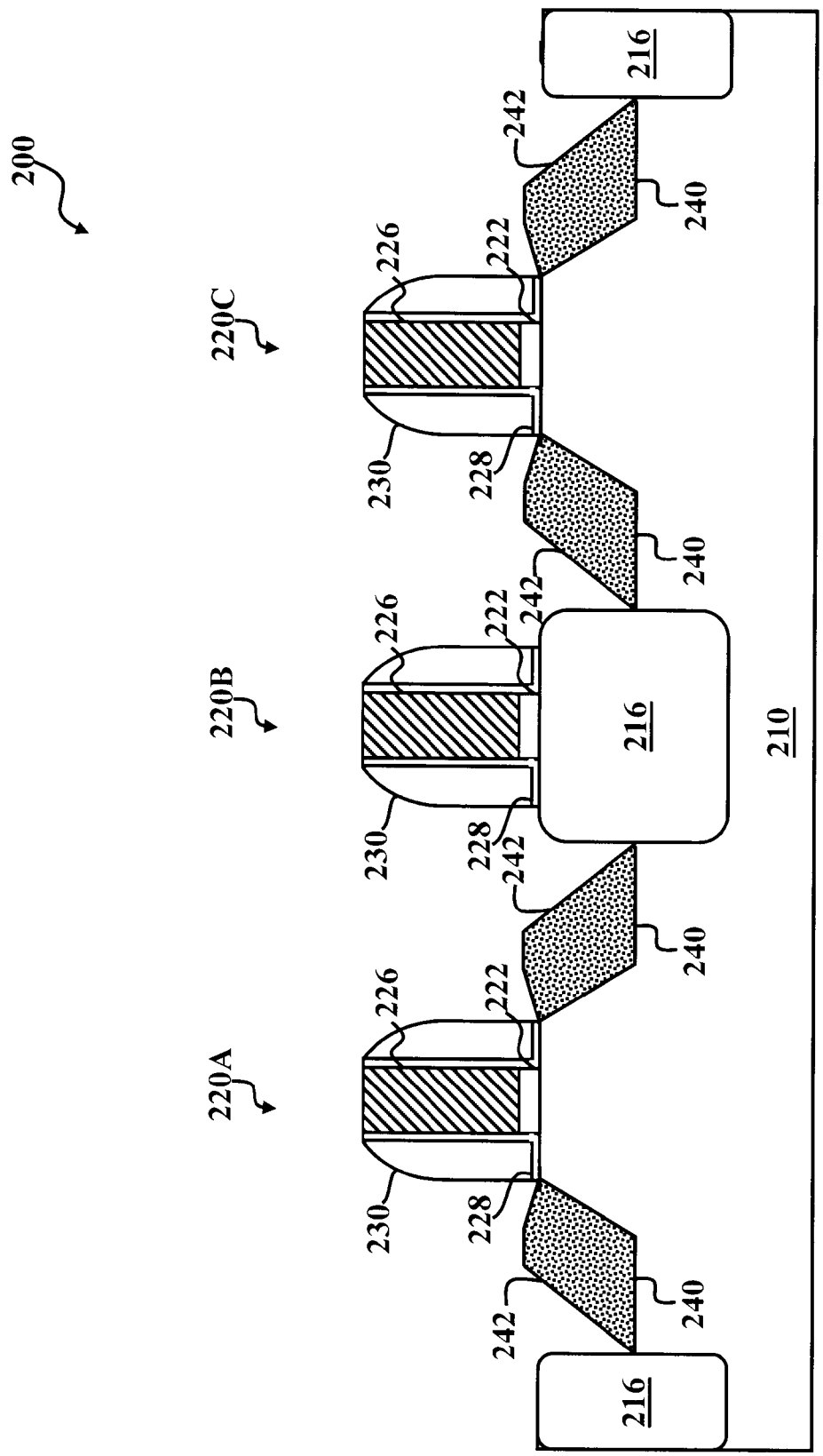
FIG. 1 and FIG. 2 are diagrammatic cross-sectional views of an integrated circuit device, in portion or entirety, at various stages of fabrication according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
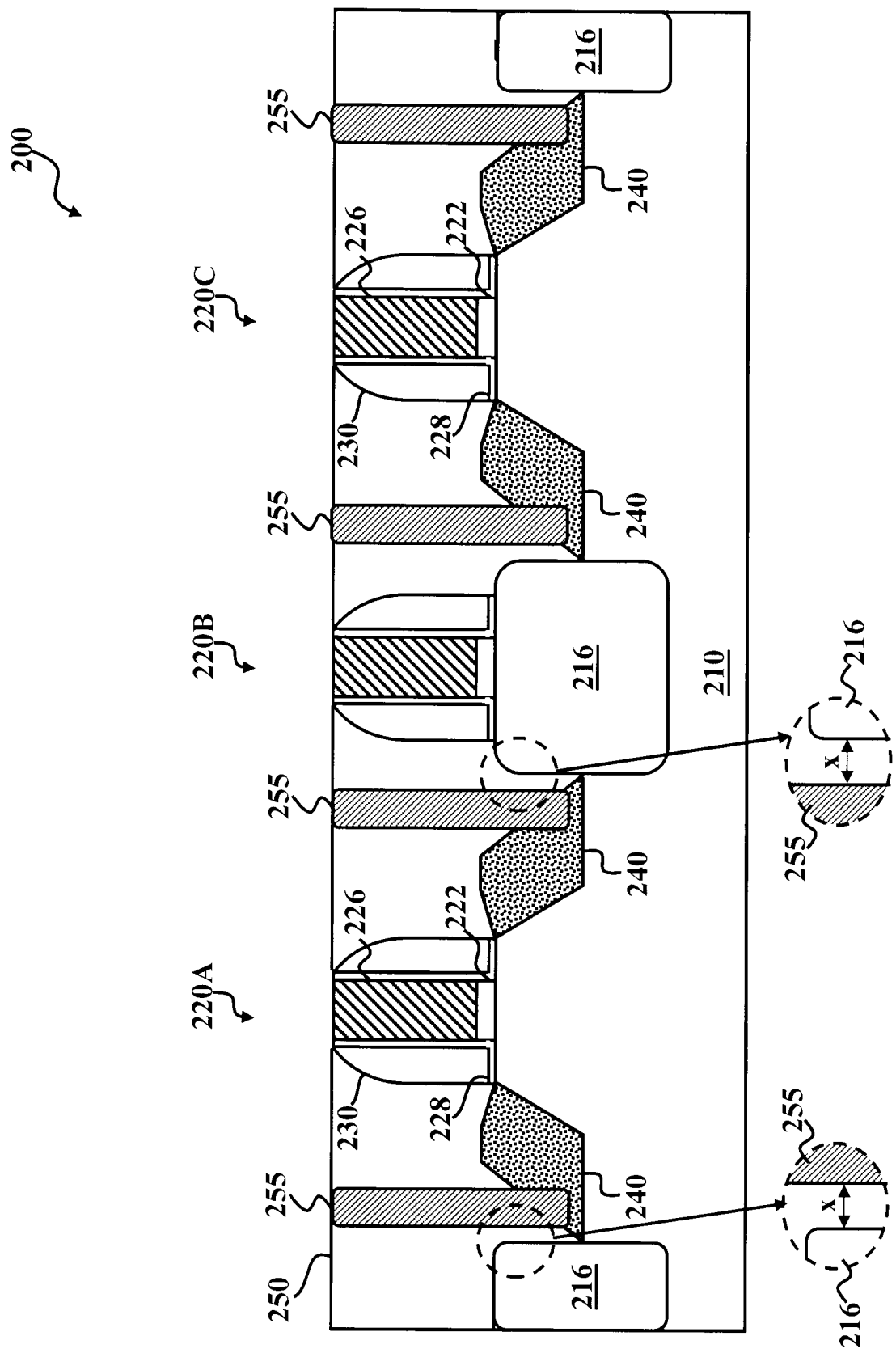

FIG. 1 and FIG. 2 are diagrammatic cross-sectional views of an integrated circuit device 200, in portion or entirety, during various fabrication stages according to various aspects of the present disclosure. FIG. 1 and FIG. 2 have been simplified for the sake of clarity to better understand the inventive concepts of the present disclosure. The integrated circuit device 200 can include memory cells and/or logic circuits; passive components such as resistors, capacitors, inductors, and/or fuses; active components, such as metal-oxide-semiconductor field effect transistors (MOSFETs), complementary metal-oxide-semiconductor transistors (CMOSs), p-channel metal-oxide-semiconductor field effect transistors (PFETs), n-channel metal-oxide-semiconductor field effect transistor (NFETs), high voltage transistors, and/or high frequency transistors; other suitable components; or combinations thereof. Additional features can be added in the integrated circuit device 200, and some of the features described below can be replaced or eliminated for additional embodiments of the integrated circuit device 200.

In FIG. 1, a substrate 210 is provided. In the depicted embodiment, the substrate 210 is a semiconductor substrate including silicon. The substrate may be a p-type or n-type substrate. Alternatively or additionally, the substrate 210 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof In yet another alternative, the substrate 210 is a semiconductor on insulator (SOI). In other alternatives, the substrate 210 may include a doped epi layer, a gradient semiconductor layer, and/or a semiconductor layer overlying another semiconductor layer of a different type, such as a silicon layer on a silicon germanium layer. The substrate 210 may include various doped regions depending on design requirements of the integrated circuit device 200 (e.g., p-type wells or n-type wells). The doped regions may be doped with p-type dopants, such as boron or $BF_2$; n-type dopants, such as phosphorus or arsenic; or a combination thereof. The doped regions may be formed directly on the substrate 210, in a P-well structure, in a N-well structure, in a dual-well structure, or using a raised structure.

Isolation feature 216 is formed in the substrate 210 to isolate various regions of the substrate 210. For example, the isolation feature 216 defines active regions of the integrated circuit device 200 in the substrate 210, in which various integrated circuit devices (such as transistor devices) are formed therein. The defined active regions may be referred to as oxide-defined active regions (put another way, OD regions of the integrated circuit device 200). The isolation feature 216 utilizes isolation technology, such as local oxidation of silicon (LOCOS) and/or shallow trench isolation (STI), to define and electrically isolate the various regions. The isolation feature 216 includes silicon oxide, silicon nitride, silicon oxynitride, other suitable materials, or combinations thereof In an example, forming an STI includes a photolithography process, etching a trench in the substrate (for example, by using a dry etching, wet etching, or combinations thereof), and filling the trench (for example, by using a chemical vapor deposition process) with one or more dielectric materials. For example, the filled trench may have a multi-layer structure, such as a thermal oxide liner layer filled with silicon nitride or silicon oxide. In another example, the STI structure may be created using a processing sequence such as: growing a pad oxide, forming a low pressure chemical vapor deposition (LPCVD) nitride layer over the pad oxide, patterning an STI opening in the pad oxide and nitride layer using photoresist and masking, etching a trench in the substrate in the STI opening, optionally growing a thermal oxide trench liner to improve the trench interface, filling the trench with oxide, using chemical mechanical polishing (CMP) processing to etch back and planarize, and using a nitride stripping process to remove the nitride layer.

Various gate structures are disposed over the substrate 210 and the isolation feature 216. In the depicted embodiment, the various gate structures include a gate structure 220A disposed over the substrate 210, a gate structure 220B disposed over the isolation feature 216 (also referred to as a dummy gate structure), and a gate structure 220C disposed over the substrate 210. The gate structures 220A, 220B, and 220C are formed by deposition processes, lithography patterning processes, etching processes, or a combination thereof. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable deposition methods, or combinations thereof. The lithography patterning processes include resist coating (such as spin-on coating), soft baking, mask aligning, exposure, post-exposure baking, developing the resist, rinsing, drying (such as hard baking), other suitable processes, or combinations thereof Alternatively, the lithography exposing process is implemented or replaced by other proper methods, such as maskless photolithography, electron-beam writing, or ion-beam writing. The etching processes include dry etching, wet etching, other etching methods, or combinations thereof.

In the depicted embodiment, the gate structures 220A, 220B, and 220C include a gate dielectric layer 222, a gate layer 226, spacer liner 228, and spacers 230. The gate dielectric layer 222 and gate layer 226 form a gate stack of the gate structures 220A, 220B, and 220C. The gate stack 220 may include additional layers depending on design requirements of the integrated circuit device 200. The gate dielectric layer 222 is formed over the substrate 210 for gate structures 220A and 220C and over the isolation feature 216 for the gate structure 220B. The gate dielectric layer 222 includes a dielectric material, such as silicon oxide, silicon oxynitride, silicon nitride, a high-k dielectric material, other suitable dielectric material, or combinations thereof. Exemplary high-k dielectric materials include $HfO_2$, HfSiO, HfSiON, HfTaO, HfTiO, HfZrO, $Ta_2O_5$, $TiO_2$, $Al_2O_3$, $ZrO_2$, $Y_2O_3$, $L_2O_3$, other suitable materials, or combinations thereof. The gate dielectric layer 222 may include a multilayer structure. For example, the gate dielectric layer 222 may include an interfacial layer, and a high-k dielectric material layer formed on the interfacial layer. An exemplary interfacial layer may be a grown silicon oxide layer formed by a thermal process or ALD process.

The gate layer 226 is formed over the gate dielectric layer 222. In the depicted embodiment, the gate layer 226 is a polycrystalline silicon (polysilicon) layer. The polysilicon layer may be doped for proper conductivity. Alternatively, the polysilicon is not necessarily doped if a dummy gate is to be formed and replaced in a subsequent gate replacement process. Alternatively, the gate layer 226 includes a conductive layer having a proper work function, therefore, the gate layer 226 can also be referred to as a work function layer. The work function layer includes any suitable material, such that the layer can be tuned to have a proper work function for enhanced performance of the associated device. For example, if a p-type work function metal (p-metal) for a PFET device is desired, the conductive layer may include TiN or TaN. On the other hand, if an n-type work function metal (n-metal) for an NFET device is desired, the conductive layer may include Ta, TiAl, TiAlN, or TaCN. The work function layer may include doped conducting oxide materials. The gate layer 226 may include other conductive materials, such as aluminum, copper, tungsten, metal alloys, metal silicide, other suitable materials, or combinations thereof.

Spacer liner 228 and spacers 230 are disposed along sidewalls of the gate stack of the gate structures 220A, 220B, and 220C (such as along sidewalls of the gate dielectric layer 222 and gate layer 226). In the depicted embodiment, the spacer liner 228 includes an oxide material, such as silicon oxide, and the spacers 230 include a nitride material, such as silicon nitride. Alternatively, the spacers 230 include another suitable dielectric material, such as silicon oxide, silicon oxynitride, or combinations thereof The spacer liner 228 may also include another suitable dielectric material. The spacer liner 228 and spacers 230 are formed by a suitable process. For example, the spacer liner 228 and spacers 230 are formed by blanket depositing a first dielectric layer (a silicon oxide layer) over the integrated circuit device 200 and a second dielectric layer (a silicon nitride layer) over the first dielectric layer, and then, anisotropically etching to remove the dielectric layers to form the spacer liner 228 and spacers 230 as illustrated in FIG. 1.

Source and drain features 240 are disposed in the substrate 210, such that the gate structures 220A and 220C interpose such source and drain features 240. The source and drain features 240 may alternatively be referred to as raised source and drain regions. An epitaxy or epitaxial (epi) process may be used to form the source and drain features 240. The epi process may include a selective epitaxy growth (SEG) process, CVD deposition techniques (e.g., vapor-phase epitaxy (VPE) and/or ultra-high vacuum CVD (UHV-CVD)), molecular beam epitaxy, other suitable epi processes, or combinations thereof. The epi process may use gaseous and/or liquid precursors, which may interact with the composition of the substrate 210. The deposited semiconductor material provides stress or strain to the channel regions of the integrated circuit device to enhance carrier mobility of the device and enhance device performance. In the depicted embodiment, silicon germanium (SiGe) is deposited by an epi process to form SiGe source and drain features 240. The source and drain features 240 may be doped with a suitable dopant, such as boron (B). Alternatively, the source and drain features 240 are silicon (Si) source and drain features, which may be doped with a suitable dopant, such as carbon (C). The source and drain features 240 may be in-situ doped or undoped during the epi process, and then doped in a subsequent process. The doping may be achieved by an ion implantation process, plasma immersion ion implantation (PIII) process, gas and/or solid source diffusion process, other suitable process, or combinations thereof. The source and drain features 240 may further be exposed to annealing processes, such as a rapid thermal annealing process.

The source and drain features 240 include a surface (or facet) 242. Such facet 242 arises from the varying growth rate of the semiconductor material of the source and drain features 240 on varying growing surfaces. For example, in the depicted embodiment, silicon germanium is epitaxially grown to form the source and drain features 240. Since silicon germanium has a different growth rate when grown on a surface of silicon (such as the substrate 210) and oxide (such as the isolation feature 216), the silicon germanium grows faster along the silicon surface (substrate 210) than the oxide surface (isolation feature 216), resulting in the facet 242 of the source and drain features 240 as illustrated in FIG. 1. The facet 242 slopes towards the isolation features 216, such that a thickness (or depth) of the source and drain features 240 is greater at the substrate 210 and the source and drain features 240 interface than the isolation feature 216 and the source and drain features 240 interface. As described below, such facet 242, and variation in thickness of the source and drain features 240, presents processing issues during processing of subsequent features of the integrated circuit device 200.

The integrated circuit device 200 may include additional features that are not illustrated. For example, lightly doped source/drain (LDD) regions and/or heavily doped source/drain (HDD) regions may be formed by ion implantation or diffusion of n-type dopants, such as phosphorous or arsenic, or p-type dopants, such as boron. The LDD and/or HDD regions may be interposed by the respective gate structures 220A and 220C. Silicide features may be formed over the source and drain features 240, for example, to reduce contact resistance. The silicide features may be formed on the source and drain features 240 by a process including depositing a metal layer, annealing the metal layer such that the metal layer is able to react with silicon to form silicide, and then removing the non-reacted metal layer.

In FIG. 2, a dielectric layer 250, such as an interlayer (or inter-level) dielectric (ILD) layer, is disposed over the substrate 210. The ILD layer 250 includes a dielectric material, such as silicon oxide, silicon nitride, silicon oxynitride, low-k dielectric material, other suitable dielectric materials, or combinations thereof. Exemplary low-k dielectric materials include fluorinated silica glass (FSG), carbon doped silicon oxide, Black Diamond® (Applied Materials of Santa Clara, California), Xerogel, Aerogel, amorphous fluorinated carbon, Parylene, BCB (bis-benzocyclobutenes), SiLK (Dow Chemical, Midland, Mich.), polyimide, other proper materials, or combinations thereof. The ILD layer 250 may include a multilayer structure having multiple dielectric materials, and additional layers may be formed overlying and/or underlying the ILD layer 250. A chemical mechanical polishing (CMP) process of the ILD layer 250 may be performed until the gate layer 226 of gate structures 220A, 220B, and 220C is exposed as illustrated in FIG. 2.

Contacts 255 extend through the ILD layer 250 and are coupled with the source and drain features 240. The contacts 255 include a conductive material, such as aluminum, copper, titanium, titanium nitride, tantalum, tantalum nitride, tungsten, polysilicon, metal silicide, alloys thereof, or combinations thereof. The contacts 255 may be formed by etching openings that extend through the ILD layer 250 and expose the source and drain features 240, and filling the etched openings with the conductive material. A processing window for the contacts 255 is significantly diminished by the facet 242 of the source and drain features 240. In the depicted embodiment, the facet 242 of the source and drain features 240 significantly reduces a contact landing window for the contacts 255, particularly an area of the source and drain features 240 that the contacts can be formed without diminishing device performance. For example, the contacts 255 are spaced a distance, x, from the isolation feature 216, and it has been observed that the closer the contacts 255 are formed to the isolation features 216, as x approaches zero, device performance may be degraded because the contact openings formed in the ILD layer 250 for the contacts 255 may extend through the source and drain features 240 to the substrate 210. In other words, while forming the contact openings in the ILD layer 250, the source and drain features 240 may be etched through. This occurs because, as noted above, due to the facet 242, the thickness of the source and drain features 240 at the isolation feature 216/source and drain features 240 interface is less than the thickness of the source and drain features 240 at the substrate 210/source and drain features 240 interface.

A multilayer interconnection (MLI) structure including metal layers and inter-metal dielectric (IMD) may also be formed over the substrate 210 to electrically connect various features or structures of the integrated circuit device 200. In an example, the ILD layer 250 and contacts 255 are a portion of the MLI structure. The multilayer interconnection includes vertical interconnects, such as conventional vias or contacts, and horizontal interconnects, such as metal lines. The various interconnection features may implement various conductive materials including copper, tungsten, aluminum, silicide, other conductive materials, or combinations thereof. A damascene process or dual damascene process may be used to form the multilayer interconnection structure.

Figure 3A:
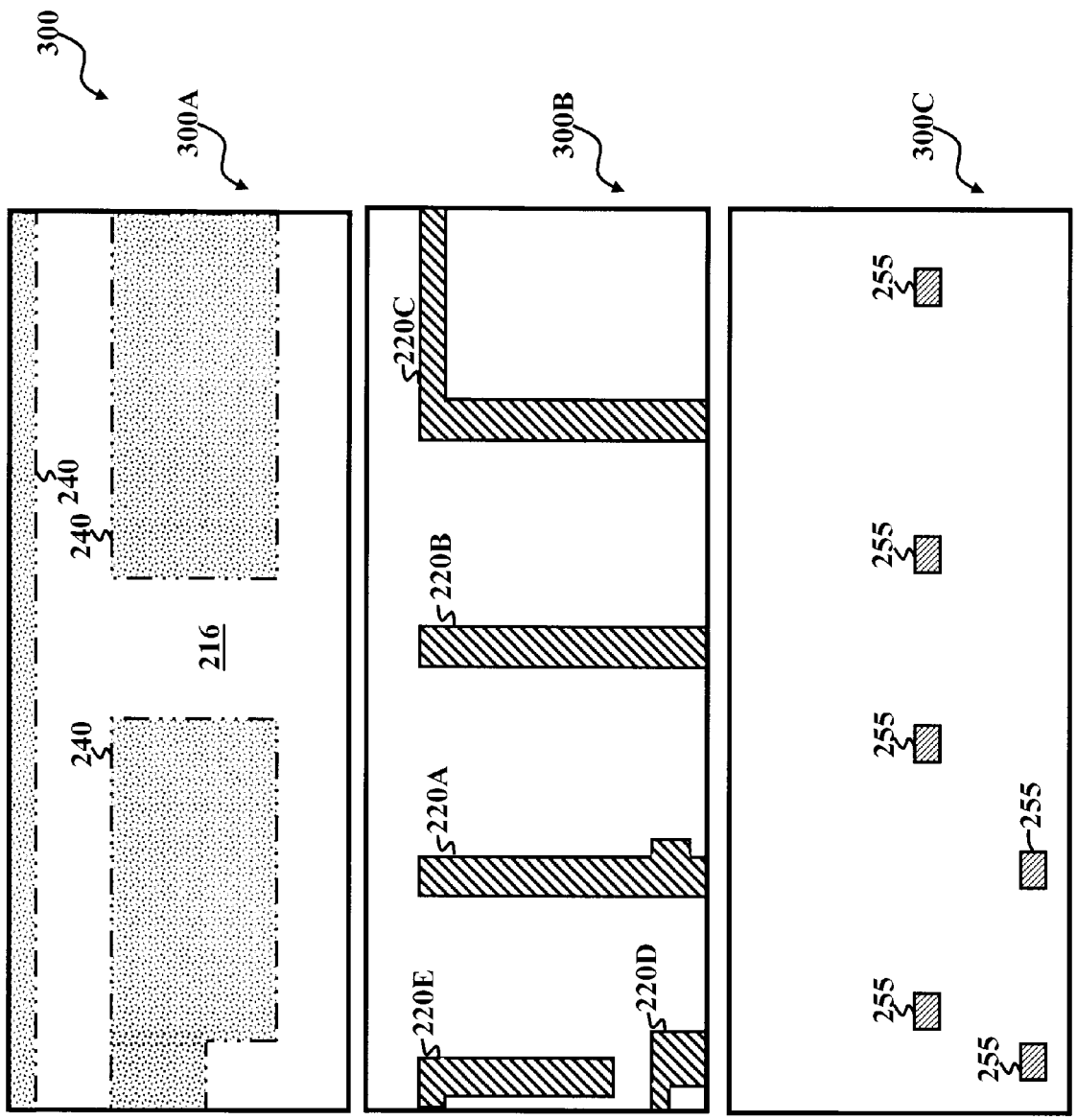
FIG. 3A is an integrated circuit design layout that includes various design layouts that can be used to fabricate the integrated circuit device of FIG. 2 according to various aspects of the present disclosure.
Figure 3B:
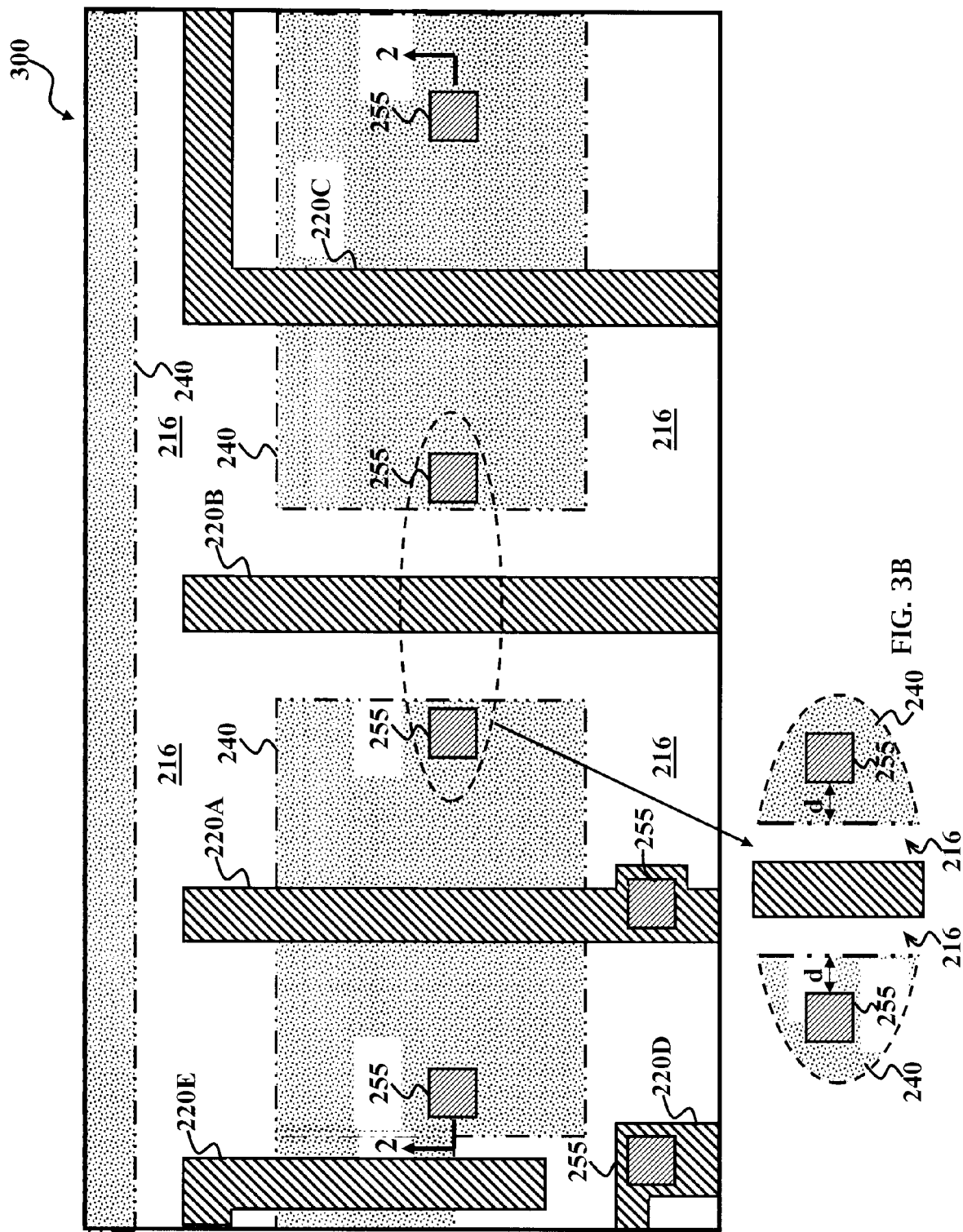
FIG. 3B includes the various design layouts of the integrated circuit design layout of FIG. 3A superimposed on one another according to various aspects of the present disclosure.

FIG. 3A is an integrated circuit design layout 300 that includes various design layouts that can be used to fabricate the integrated circuit device 200 of FIG. 2 according to various aspects of the present disclosure. FIG. 3B includes the various design layouts of the integrated circuit design layout 300 superimposed on one another according to various aspects of the present disclosure. The portion of the integrated circuit device 200 illustrated in FIG. 2 is associated with the integrated circuit design layout 300 along line 2-2 in FIG. 3B. FIG. 3A and FIG. 313 will be discussed concurrently and have been simplified for the sake of clarity to better understand the inventive concepts of the present disclosure.

The integrated circuit design layout 300 can be expressed in any suitable format, such as in GDS format. The integrated circuit design layout 300 may be in a GDSII file format (or DFII file format). The integrated circuit design layout 300 includes various geometrical patterns designed for an integrated circuit product, such as the integrated circuit device 200, based on a specification of the integrated circuit product. The integrated circuit design layout 300 is presented in one or more data files having information of the geometrical patterns. For example, in the depicted embodiment, the integrated circuit design layout 300 includes design layout 300A, design layout 300B, and design layout 300C. Design layout 300A, design layout 300B, and design layout 300C each include a set of the various geometrical patterns of the integrated circuit design layout 300 that combine to form features of the integrated circuit device 200. For example, the design layout 300A includes geometrical patterns that define the isolation feature 216, which defines various active regions of the integrated circuit device 200. In the depicted embodiment, the active regions are represented by the source and drain features 240. The design layout 300B includes a set of geometrical patterns that define the gate structure 220A, gate structure 220B, and gate structure 220C, along with a gate structure 220D and a gate structure 220E. The design layout 300C includes a set of geometrical patterns that define the contacts 255 of the integrated circuit device 200.

The design layouts 300A, 300B, and 300C are used to fabricate masks that are used to form each feature of the integrated circuit device. The masks can be formed in various technologies. For example, the masks may be formed using a binary technology. The binary mask includes a transparent substrate (e.g., fused quartz) and an opaque material (e.g., chromium) coated in the opaque regions of the mask. In another example, the masks are formed using a phase shift technology, where various features in the pattern formed on the masks are configured to have proper phase difference to enhance the resolution and imaging quality. In various examples, the phase shift mask can be an attenuated PSM or alternating PSM. Other processing steps may follow after the formation of the mask. In the depicted embodiment, each of the masks (based on the design layouts 300A, 300B, and 300C) is then used to form the integrated circuit device 200 as illustrated in FIGS. 1 and 2.

As illustrated in FIG. 3B, the various design layouts 300A, 300B, and 300C have a spatial relationship, such that the various features of the integrated circuit device 200 are appropriately placed. For example, the gate structures 220A, 220B, 220C, 220D, and 220E are disposed over active regions (such as source and drain features 240) and/or isolation feature 216 of the integrated circuit device 200; and the various contacts 255 are disposed over the active regions (such as source and drain features 240) and gate structures (such as gate structure 220A and gate structure 220D). Ideally, the alignment of the various features of the integrated circuit device 200 track alignment of the various features depicted in the integrated circuit design layout 300. For example, an exploded view of the contacts 255 to the source and drain features 240 associated with the gate structures 220A and 220C, respectively, shows that the integrated circuit design layout 300 specifies a distance, d, between the contacts 255 and the isolation feature 216. The active region (more specifically, the source and drain features 240) spans between the contacts 255 and the isolation feature 216 in this distance. Such distance, d, corresponds with the distance, x, between the contacts 255 and the isolation feature 216 in the integrated circuit device 200 illustrated in FIG. 2. As noted above, during processing, the source and drain features 240 may include facets 242 that cause thickness variation in the source and drain features 240. Accordingly, though the distance, x, between the contacts 255 and the isolation feature 216 in the integrated circuit device 200 illustrated in FIG. 2 may be equivalent to or within an acceptable range from distance, d, specified by the integrated circuit design layout 300, during fabrication, the contacts 255 may extend through the source and drain features 240 to the substrate 210 because of the thickness variation caused by the facets 242 of the source and drain features 240. Alternatively or additionally, the contacts 255 may not be adequately coupled with the source and drain features 240, again resulting from the facets 242 of the source and drain features 240. Such problems are further exacerbated when processing limitations are considered, such as overlay error arising in alignment of the various masks based on the design layouts 300A, 300B, and 300C. For example, where the distance, d, is specified at about 10 nm, but overlay error in alignment of a contact mask (mask used to form the contacts 255 based on the design layout 300C) and active region mask (mask used to form the isolation feature 216, which defines areas where the source and drain features are formed, based on design layout 300A) is ±12 nm (in other words, the overlay error is larger than the specified distance), the contacts 255 are more likely to land on an area of the active region (source and drain features 240) having an insufficient thickness or an area of the active region where the contact holes for forming the contacts 255 have etched through the active region (source and drain features 240).

Figure 4A:
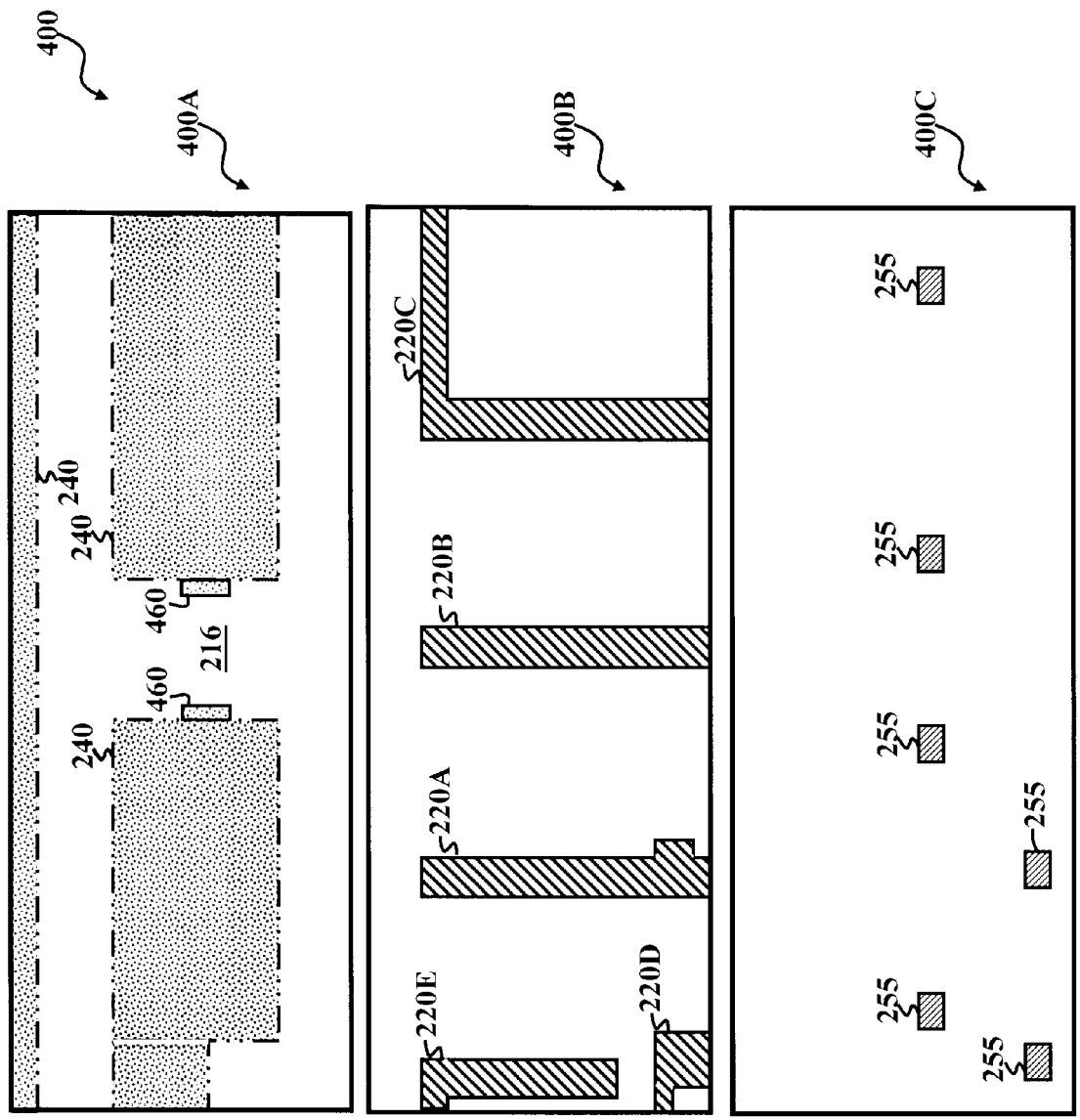
FIG. 4A is another integrated circuit design layout that includes various design layouts that can be used to fabricate the integrated circuit device of FIG. 2 according to various aspects of the present disclosure.
Figure 4B:
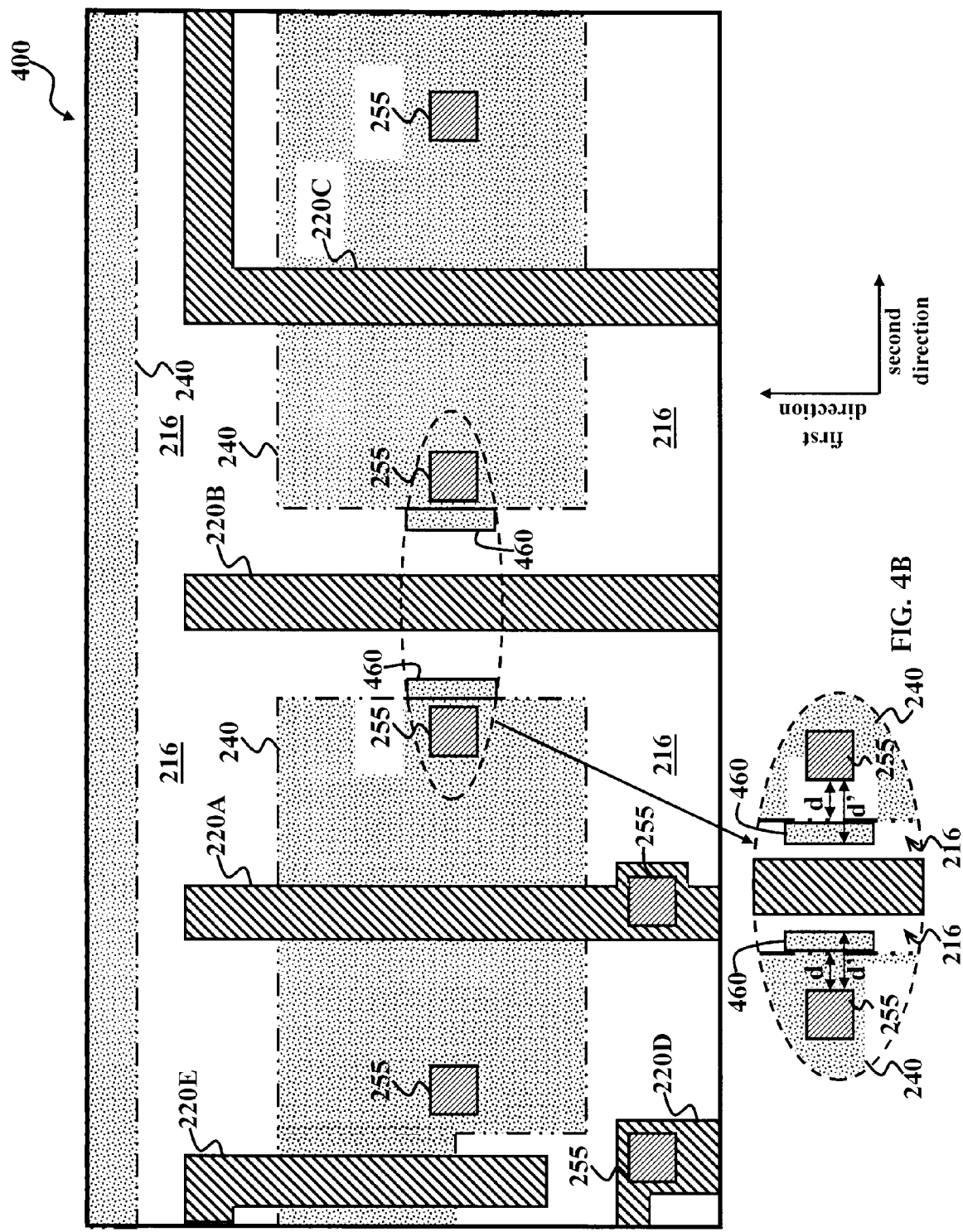
FIG. 4B includes the various design layouts of the integrated circuit design layout of FIG. 4A superimposed on one another according to various aspects of the present disclosure.

FIG. 4A is another integrated circuit design layout 400 that includes various design layouts that can be used to fabricate the integrated circuit device 200 of FIG. 2 according to various aspects of the present disclosure. FIG. 4B includes the various design layouts of the integrated circuit design layout 400 superimposed on one another according to various aspects of the present disclosure. FIG. 4A and FIG. 4B will be discussed concurrently and have been simplified for the sake of clarity to better understand the inventive concepts of the present disclosure. Further, the integrated circuit design layout 400 of FIGS. 4A and 4B is similar in many respects to the integrated circuit device 400 of FIGS. 3A and 3B. Accordingly, similar features in FIGS. 4A and 4B and FIGS. 3A and 3B are identified by the same reference numerals for clarity and simplicity.

The integrated circuit design layout 400 can be expressed in any suitable format, such as in GDS format. The integrated circuit design layout 400 may be in a GDSII file format (or DFII file format). The integrated circuit design layout 400 includes various geometrical patterns designed for an integrated circuit product, such as the integrated circuit device 200, based on a specification of the integrated circuit product. The integrated circuit design layout 400 is presented in one or more data files having information of the geometrical patterns. For example, in the depicted embodiment, the integrated circuit design layout 400 includes design layout 400A, design layout 400B, and design layout 400C. Design layout 400A, design layout 400B, and design layout 400C each include a set of the various geometrical patterns of the integrated circuit design layout 400 that combine to form features of the integrated circuit device 200. For example, similar to the design layout 300A, the design layout 400A includes geometrical patterns that define the isolation feature 216, which defines various active regions of the integrated circuit device 200. In the depicted embodiment, the active regions are represented by the source and drain features 240. Similar to design layout 300B, the design layout 400B includes a set of geometrical patterns that define the gate structure 220A, gate structure 220B, and gate structure 220C, along with the gate structure 220D and the gate structure 220E. Similar to design layout 300C, the design layout 400C includes a set of geometrical patterns that define the contacts 255 of the integrated circuit device 200.

To address issues arising from fabricating the integrated circuit device 200 according to the integrated circuit design layout 300, the integrated circuit design layout 300 may be modified to enlarge a processing window for forming the contacts 255, such as the contact landing window. In the depicted embodiment, the design layout 300A of the integrated circuit design layout 300 is modified to provide the design layout 400A of the integrated circuit design layout 400. More specifically, the design layout that defines the isolation feature, and thus, defines various active regions of the integrated circuit device, is modified to enlarge the contact landing window. The design layout 300A may be modified using optical proximity correction (OPC) features. For example, referring to FIG. 4A, the design layout 400B is similar to the design layout 300A except that the design layout 400A includes supplementary active region features 460. The supplementary active region features 460 are positioned adjacent to the active regions of the design layout 400A (here, the source and drain features 240). Referring to FIG. 4B, when the design layouts 400A, 400B, and 400C are superimposed on one another, the supplementary active region features 460 are positioned adjacent to the contacts 255. The supplementary active region features 460 have a dimension that extends in a first direction (such as a length) and a dimension that extends in a second direction (such as a width); the contacts 255 have a dimension that extends in the first direction (such as a contact length) and a dimension that extends in the second direction (such as a contact width); and the active region features (source and drain features 240) have a dimension that extends in the first direction (such as an active region length) and a dimension that extends in the second direction (such as an active region width). In the depicted embodiment, a length of a supplementary active region 460 is greater than a length of a contacts 255 and less than a length of an active region feature (source and drain feature) 240. It is noted that the supplementary active regions 460 have dimensions greater than a sub-resolution feature, such that the supplementary active region features 460 are formed on the masks fabricated according to the integrated circuit design layout 400 (specifically the mask fabricated according to design layout 400A), and thus, the supplementary active region features 460 are formed in the integrated circuit device using such masks.

The supplementary active regions 260 decrease an area of the isolation feature 216 in the integrated circuit design layout 400. The supplementary active regions 460 also increase a distance between the contacts 255 and the isolation feature 216. For example, the distance, d, between the contacts 255 and the isolation features 216 (as specified by the integrated circuit design layout 300) is increased to a distance, d', between the contacts 255 and the isolation features 216 in the integrated circuit design layout 400. In an example, supplemental active region features 460 are added to the integrated circuit design layout 400 (specifically the design layout 400A) where the distance, d, between a contact and an isolation feature specified by the integrated circuit design layout 300 is equal to a minimum design rule distance, such as a critical dimension. In another example, supplemental active region feature 460 are added to the integrated circuit design layout 400 (specifically the design layout 400A) where the distance, d, between a contact and an isolation feature specified by the integrated circuit design layout 300 is less than a specified value, such as less than 1.05 times the minimum design rule distance. For example, if d equals the minimum design rule distance, supplementary active regions 460 have a thickness (or width) that ensures that d' is greater than or equal to about 1.05d (d'≥1.05d).

The design layouts 400A, 400B, and 400C are used to fabricate masks that are used to form each feature of the integrated circuit device. The masks can be formed in various technologies. For example, the masks may be formed using a binary technology. The binary mask includes a transparent substrate (e.g., fused quartz) and an opaque material (e.g., chromium) coated in the opaque regions of the mask. In another example, the masks are formed using a phase shift technology, where various features in the pattern formed on the masks are configured to have proper phase difference to enhance the resolution and imaging quality. In various examples, the phase shift mask can be an attenuated PSM or alternating PSM. Other processing steps may follow after the formation of the mask. In the depicted embodiment, each of the masks (based on the design layouts 400A, 400B, and 400C) is then used to form the integrated circuit device 200 as illustrated in FIGS. 1 and 2.

During processing, by adding the supplementary active regions 460, a slope of the facet 242 of the source and drain features 240 may be increased, thereby decreasing the thickness variation arising in the source and drain features 240. The increased slope of the facet 242 thus increases a landing area for the contacts 255, for example, by providing sufficient thickness of the source and drain features 240 to ensure adequate contact landing and/or to prevent etching through the source and drain features 240 to the substrate 210. These supplementary active regions 460 can also overcome overlay error issues arising from alignment of the masks created from the various design layouts (design layout 400A, 400B, and 400C) of the integrated circuit design layout 400. Different embodiments may have different advantages, and no particular advantage is necessarily required of any embodiment.

Figure 5:
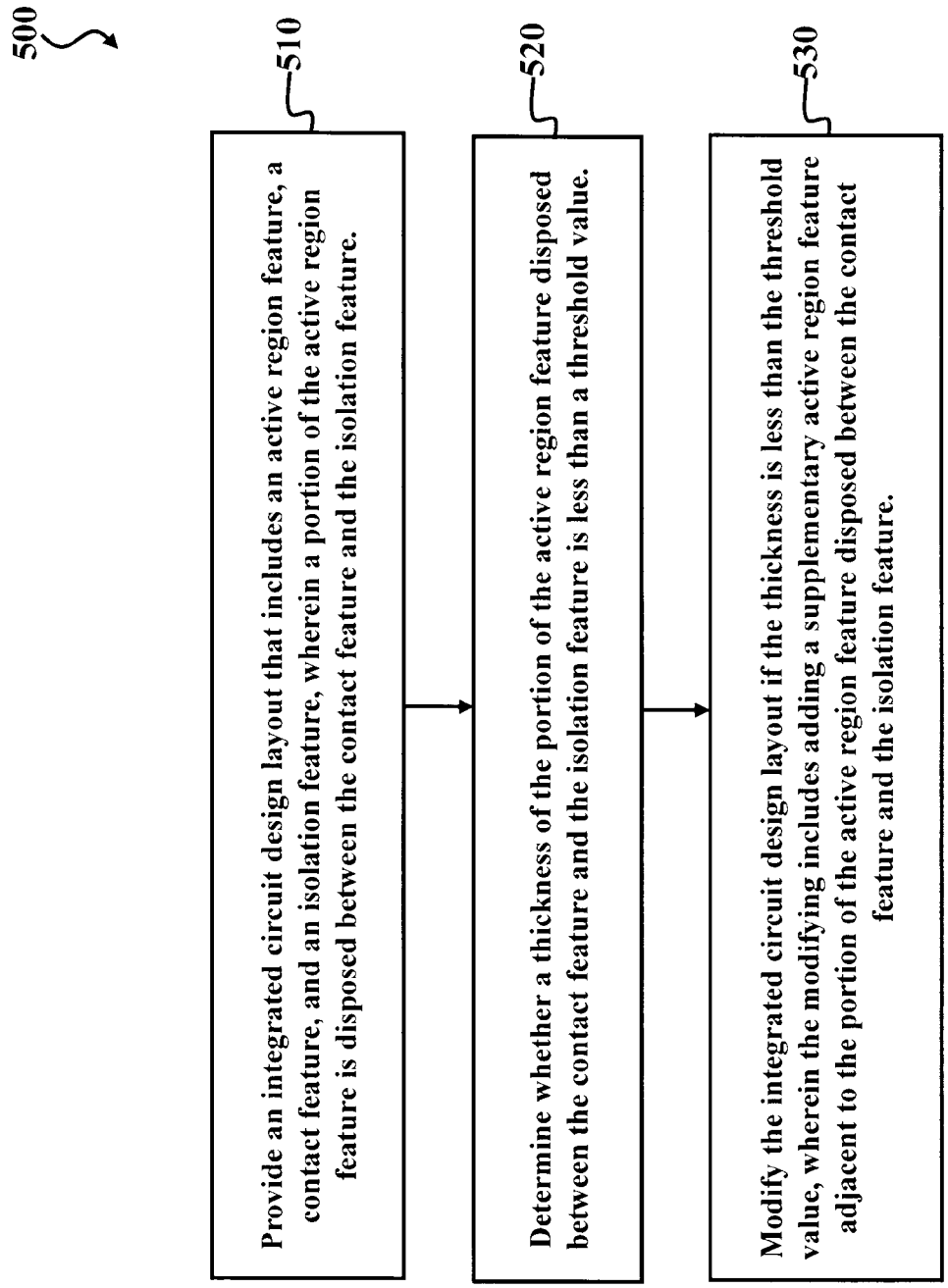
FIG. 5 is a flowchart of an integrated circuit design method according to various aspects of the present disclosure.

FIG. 5 is a flowchart of a method 500 for integrated circuit design constructed according to various aspects of the present disclosure. The method 500 begins at block 510 by providing an integrated circuit design layout. A designer may provide the integrated circuit design layout. In an example, the designer is a design house or a design team that is separate from a semiconductor manufacturer (or integrated circuit fab) that is assigned to make integrated circuit product according to the integrated circuit design layout. In an example, the semiconductor manufacturer is a semiconductor foundry. The integrated circuit design layout includes various geometrical patterns designed for an integrated circuit product, based on a specification of the IC product. The integrated circuit design layout is presented in one or more data files having information of the geometrical patterns. For example, the integrated circuit design layout can be expressed in any suitable format, such as in GDS format. The IC design layout may be in a GDSII file format (or DFII file format).

The designer, based on the specification of the IC product to be manufactured, implements a proper design procedure to form the IC design layout. The design procedure may include logic design, physical design, and/or place and route. In an example, for illustration, a portion of the IC design layout includes various integrated circuit features, such as an active region, gate electrode, source and drain, metal lines or via of an interlayer interconnection, and openings for bonding pads, to be formed in a semiconductor substrate (such as a silicon wafer) and various material layers disposed on the semiconductor substrate. The integrated circuit design layout is then provided by the designer to the semiconductor manufacturer assigned or contracted for making the integrated circuit products according to the integrated circuit design layout. Alternatively, the semiconductor manufacturer can pull the original design layout from manufacturing data in a database of the semiconductor manufacturer. In the depicted embodiment, the integrated circuit design layout may be similar to the integrated circuit design layout 300 illustrated in FIGS. 3A and 3B, described above.

At block 520, the method 500 determines whether a thickness of the portion of the active region feature disposed between the contact feature and the isolation feature is less than a threshold value. For example, the method 500 evaluates the integrated circuit design layout 300 to determine whether the distance, d, between the contact 255 and the isolation feature 216 is less than a threshold value. The threshold value may be a critical dimension, such as a minimum design rule distance. The threshold value may be a minimum design rule distance (MDRD) times a specified factor (such as about 1.05). For example, it is determined whether the d<1.05MDRD. In the depicted embodiment, the distance, d is less than the threshold value.

At block 530, the method 500 modifies the integrated circuit design layout if the thickness is less than the threshold value. In the depicted embodiment, as noted above, the distance, d, is less than the threshold value, and thus, the integrated circuit design layout 300 is modified. Modifying integrated circuit design layout includes adding a supplementary active region feature adjacent to the portion of the active region feature disposed between the contact feature and the isolation feature. For example, the integrated circuit design layout 300 is modified to provide the integrated circuit design layout 400 illustrated in FIGS. 4A and 4B, where the supplementary active region features 460 are incorporated into the integrated circuit design layout. Additional steps can be provided before, during, and after the method 500, and some of the steps described below can be replaced or eliminated for additional embodiments of the method.

In the depicted embodiment, determination (block 520) and modification (block 530) are implemented during an optical proximity correction (OPC) process where the integrated circuit design layout 300 is evaluated to determine whether OPC features (such as scattering bars, serif, and/or hammerheads) should be added to the integrated circuit design layout. Various OPC features (and/or bias) is added or repositioned according to an optical model or rules such that, after a lithography process, a final pattern on a wafer is improved, for example, with enhanced resolution and precision. In the depicted embodiment, the supplementary active region feature 460 is an OPC feature added to the integrated circuit design layout 300, thereby providing the integrated circuit design layout 400. The supplementary active region feature 460 is greater than a sub-resolution feature so that it is printed on a mask (or wafer). The OPC process may be included in a re-targeting process.

A mask or group of masks are fabricated based on the integrated circuit design layout, which may have been modified by the method 500. For example, an electron beam (e-beam) or multiple e-beams are used to form a pattern on a mask (photomask or reticle) based on the integrated circuit design layout. The mask can be formed in various technologies. In an example, the mask is formed using binary technology. In an example, a mask pattern includes opaque regions and transparent regions. A radiation beam, such as an ultraviolet (UV) beam, used to expose the image sensitive material layer (a resist layer) coated on a wafer, is blocked by the opaque region and transmits through the transparent regions. In one example, a binary mask includes a transparent substrate (such as fused quartz) and an opaque material (such as chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM known in the art.

Other processing steps may follow after the formation of the mask. For example, in the depicted embodiment, a semiconductor wafer is fabricated using the mask formed by the above method. The semiconductor wafer includes a silicon substrate or other proper substrate having material layers formed thereon. Other proper substrate materials include a suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The semiconductor wafer may further include various doped regions, dielectric features, and multilevel interconnects (or formed at subsequent manufacturing steps). The mask may be used in a variety of processes. For example, the mask may be used in an ion implantation process to form various doped regions in the semiconductor wafer, in an etching process to formed various etching regions in the semiconductor wafer, in a deposition process (e.g., chemical vapor deposition (CVD) or physical vapor deposition (PVD)) to form a thin film in various regions on the semiconductor wafer, and/or other suitable processes. Various manufacturing data may be collected from various manufacturing processes including CVD, PVD, etching, ion implantation, and lithography processes from the previously processed semiconductor wafers, processing tools, and metrology tools.

The determination (at block 520) and modification (at block 530) may implement a logic operation (or LOP) to the integrated circuit design layout. The logic operation modifies the integrated circuit design layout according to manufacturing rules. The logic operation may be performed by the semiconductor manufacturer. Various manufacturer modules convert manufacturing constraints into a set of rules that the integrated circuit design layout has to meet. If the integrated circuit design layout does not meet this set of rules, the integrated circuit design layout will be modified accordingly until the modified integrated circuit design layout meets these rules. Such modification is implemented by the logic operation. Such determination and modification may implement a pre-process and swap process. During the pre-process and swap process, the geometrical patterns in the integrated circuit design layout are divided, matched, and replaced for repetitive blocks of the integrated circuit design layout, such that the integrated circuit design layout is simplified for further processing. For example, in order to reduce process costs and time with enhanced efficiency, a repetitive pattern is replaced such that any further modification to the repetitive pattern will not be repeated for each repetitive pattern. If a repetitive pattern appears in various designs, it can be extracted into a database or library for future use. In this case, the repetitive pattern is replaced by a standard pattern in a library. Such determination and modification may implement an iteration and correction process to the integrated circuit design pattern. The process of adding the OPC features can be iterated and enhanced until the formed integrated circuit design layout can achieve high resolution or meet expected criteria based on the final pattern to be formed in the wafer. Here, the iteration and correction process may be implemented according to a simulation result, such as proximity effect by simulation. For example, the integrated circuit design layout is tuned according to simulated wafer results by lithography processes and/or etching processes. In an example, the simulation takes manufacturing data from the semiconductor manufacturer, such as data from the lithography exposing process and/or etching process, as inputs and provides a virtual developed resist pattern or etched pattern as output. Various features of the integrated circuit IC design layout, such as added OPC features, may be repositioned or resized for manufacturing benefits and/or product performance improvement, such as lithography resolution enhancement. Additionally or alternatively, other features may be added or other actions may be applied to the integrated circuit design layout. For example, dummy insertion features may be added to the IC design layout for enhanced chemical mechanical polishing (CMP) or other processing advantages. A mask rule check (MRC) may be performed on the integrated circuit design layout at the determination and modification blocks. This involves further checking the integrated circuit design layout according to mask rules and modifying the integrated circuit design layout if needed. For example, the mask rules in the MRC process are extracted from a mask fabrication module, such as a mask shop. The mask fabrication module may be a part of the semiconductor manufacturer. Various mask making data are collected from the mask fabrication module and extracted into a set of rules that the integrated circuit design layout, as a pattern to be imaged to a mask, should follow. Additionally or alternatively, the mask rules or a subset of the mask rules are used as a guideline to tune the integrated circuit design layout. The MRC process may also or alternatively implement a design rule check (DRC) process.

The present disclosure can take the form of an entirely hardware embodiment, an entirely software embodiment, or an embodiment containing both hardware and software elements. Furthermore, embodiments of the present disclosure can take the form of a computer program product accessible from a tangible computer-usable or computer-readable medium providing program code for use by or in connection with a computer or any instruction execution system. For the purposes of this description, a tangible computer-usable or computer-readable medium can be any apparatus that can contain, store, communicate, propagate, or transport the program for use by or in connection with the instruction execution system, apparatus, or device. The medium can be an electronic, magnetic, optical, electromagnetic, infrared, a semiconductor system (or apparatus or device), or a propagation medium.

The present disclosure provides for many different embodiment. In an example, a method includes receiving an integrated circuit design layout that includes an active region feature, a contact feature, and an isolation feature, wherein a portion of the active region feature is disposed between the contact feature and the isolation feature; determining whether a thickness of the portion of the active region feature disposed between the contact feature and the isolation feature is less than a threshold value; and modifying the integrated circuit design layout if the thickness is less than the threshold value, wherein the modifying includes adding a supplementary active region feature adjacent to the portion of the active region feature disposed between the contact feature and the isolation feature. The method may further include fabricating a mask according to the integrated circuit design layout. The threshold value may be a minimum design rule thickness. In an example, adding the supplementary active region feature includes adding a supplementary active region feature having a thickness, such that the thickness of the supplementary active region feature and the thickness of the portion of the active region feature is greater than or equal to the threshold value. Adding the supplementary active region feature may include increasing a contact landing window for the contact feature. In an example, modifying the integrated circuit design layout includes modifying a design layout of the integrated circuit design layout that includes the isolation feature and the active region feature, wherein the isolation feature defines the active region feature of the integrated circuit device. Adding the supplementary active region feature may include reducing an area of the isolation feature by an area of the supplementary active region feature. In an example, adding the supplementary active region is performed during an optical proximity correction (OPC) process.

In yet another example, a method includes receiving an integrated circuit design layout designed to define an integrated circuit, wherein the integrated circuit design layout includes a first layout including an isolation feature that defines an active region of the integrated circuit and a second layout that includes a contact feature, wherein the first layout and the second layout have a spatial relationship where the contact feature is disposed over the active region such that the contact feature is spaced a first distance from the isolation feature; modifying the first layout that includes the isolation feature that defines the active region of the integrated circuit if the first distance fails to meet a threshold distance, wherein the modifying includes adding a supplementary active region feature adjacent to the active region, such that the first distance from the isolation feature is increased to a second distance from the isolation feature, the second distance being greater than or equal to the threshold distance; and fabricating a mask according to the first layout if the first distance meets the threshold distance and according to the modified first layout if the first distance fails to meet the threshold distance.

In an example, the threshold distance is a critical dimension. In another example, the threshold distance is a minimum design rule distance times a specified factor. For example, the threshold distance is the minimum design rule distance times about 1.05. Modifying the first layout that includes the isolation feature that defines the active region of the integrated circuit device may include reducing an area of the isolation feature by an area of the supplementary active region feature. Adding the supplementary active region feature adjacent to the active region includes increasing a contact landing window.

The method may further include fabricating a mask according to the second layout. The method may further include forming an isolation feature in a substrate of the integrated circuit using the mask fabricated according to the modified first layout, wherein the isolation feature defines an active region of the substrate; and forming a contact to the active region of the integrated circuit using the mask fabricated according to the second layout. Forming the contact to the active region of the integrated circuit may include forming the contact to an epitaxial source and drain feature of the integrated circuit. In an example, the integrated circuit design layout further includes a third layout including a gate feature, wherein the first layout, second layout, and third layout have a spatial relationship where the contact feature is disposed over the active region between the gate feature and the isolation feature, such that the active region has a dimension between the gate feature and the isolation feature; and the adding the supplementary active region feature adjacent to the active region, such that the first distance from the isolation feature is increased to the second distance from the isolation feature includes increasing the dimension between the gate feature and the isolation feature.

In yet another example, an integrated circuit (IC) device includes a substrate; an isolation feature disposed in the substrate, the isolation feature defining a boundary of an active region of the substrate, wherein the active region has a first active region dimension that extends in a first direction and a second active region dimension that extends in a second direction; a contact feature disposed over the active region such that a portion of the active region is disposed between the contact feature and the isolation feature, the contact feature having a first contact feature dimension that extends in the first direction and a second contact feature dimension that extends in the second direction; and a gate feature disposed over the active region. The active region includes a supplementary active region portion disposed adjacent to the portion of the active region that is disposed between the contact feature and the isolation feature. The supplementary active region portion has a first supplementary active region portion dimension that extends in the first direction and a second supplementary active region portion dimension that extends in the second direction, the first supplementary active region portion dimension being greater than the first contact feature dimension and less than the first active region dimension, and further wherein the second supplementary active region portion dimension is greater than a sub-resolution dimension. A thickness of the portion of the active region and the supplementary active region portion may be greater than a critical dimension. A thickness of the portion of the active region and the supplementary active region portion may be greater than 1.05 times a minimum design rule distance between the contact feature and the isolation feature.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments disclosed herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method comprising:
receiving an integrated circuit design layout that includes an active region feature, a contact feature, and an isolation feature, wherein a portion of the active region feature is disposed between the contact feature and the isolation feature;
determining whether a thickness of the portion of the active region feature disposed between the contact feature and the isolation feature is less than a threshold value;
modifying the integrated circuit design layout if the thickness is less than the threshold value, wherein the modifying includes adding a supplementary active region feature adjacent to the portion of the active region feature disposed between the contact feature and the isolation feature during an optical proximity correction (OPC) process; and
fabricating a mask according to the integrated circuit design layout.

2. The method of claim I wherein the threshold value is a function of a minimum design rule distance times a specified factor.

3. The method of claim 2 wherein the specified factor is about 1.05.

4. The method of claim 1 wherein the determining whether the thickness of the portion of the active region feature disposed between the contact feature and the isolation feature is less than the threshold value includes determining whether the thickness is less than or equal to a minimum design rule thickness.

5. The method of claim 1 wherein the modifying the integrated circuit design layout includes modifying a design layout of the integrated circuit design layout that includes the isolation feature and the active region feature, wherein the isolation feature defines the active region feature of the integrated circuit device.

6. The method of claim 4 wherein the adding the supplementary active region feature includes reducing an area of the isolation feature by an area of the supplementary active region feature.

7. The method of claim 1 wherein the adding the supplementary active region feature includes adding a supplementary active region feature having a thickness, such that the thickness of the supplementary active region feature and the thickness of the portion of the active region feature is greater than or equal to the threshold value.

8. The method of claim 1 wherein the adding the supplementary active region feature includes increasing a contact landing window for the contact feature.

9. A method comprising:
receiving an integrated circuit design layout designed to define an integrated circuit, wherein the integrated circuit design layout includes a first layout including an isolation feature that defines an active region of the integrated circuit and a second layout that includes a contact feature, wherein the first layout and the second layout have a spatial relationship where the contact feature is disposed over the active region such that the contact feature is spaced a first distance from the isolation feature;
modifying, using a computer, the first layout that includes the isolation feature that defines the active region of the integrated circuit if the first distance fails to meet a threshold distance, wherein the modifying includes adding a supplementary active region feature adjacent to the active region, such that the first distance from the isolation feature is increased to a second distance from the isolation feature, the second distance being greater than or equal to the threshold distance; and
wherein the threshold distance is a minimum design rule distance times a specified factor.

10. The method of claim 9 wherein the modifying the first layout that includes the isolation feature that defines the active region of the integrated circuit device includes reducing an area of the isolation feature by an area of the supplementary active region feature.

11. The method of claim 9 wherein the specified factor is about 1.05.

12. The method of claim 9 further including fabricating a mask according to the first layout if the first distance meets the threshold distance and according to the modified first layout if the first distance fails to meet the threshold distance.

13. The method of claim 12 further including fabricating a mask according to the second layout.

14. The method of claim 13 further including:
forming an isolation feature in a substrate of the integrated circuit using the mask fabricated according to the modified first layout, wherein the isolation feature defines an active region of the substrate; and
forming a contact to the active region of the integrated circuit using the mask fabricated according to the second layout.

15. The method of claim 14 wherein the forming the contact to the active region of the integrated circuit includes forming the contact to an epitaxial source and drain feature of the integrated circuit.

16. The method of claim 9 wherein:
the integrated circuit design layout further includes a third layout including a gate feature, wherein the first layout, second layout, and third layout have a spatial relationship where the contact feature is disposed over the active region between the gate feature and the isolation feature, such that the active region has a dimension between the gate feature and the isolation feature; and
the adding the supplementary active region feature adjacent to the active region, such that the first distance from the isolation feature is increased to the second distance from the isolation feature includes increasing the dimension between the gate feature and the isolation feature.

17. The method of claim 9 wherein the adding the supplementary active region feature adjacent to the active region includes increasing a contact landing window.

18. An integrated circuit (IC) device comprising:
an isolation feature disposed on a substrate, the isolation feature defining a boundary of an active region of the substrate, wherein the active region has a first active region dimension that extends in a first direction and a second active region dimension that extends in a second direction;
a contact feature disposed over the active region such that a portion of the active region is disposed between the contact feature and the isolation feature, the contact feature having a first contact feature dimension that extends in the first direction and a second contact feature dimension that extends in the second direction; and wherein the active region includes a supplementary active region portion disposed adjacent to the portion of the active region that is disposed between the contact feature and the isolation feature, wherein the supplementary active region portion has a first supplementary active region portion dimension that extends in the first direction and a second supplementary active region portion dimension that extends in the second direction, the first supplementary active region portion dimension being greater than the first contact feature dimension and less than the first active region dimension.

19. The integrated circuit device of claim 18 wherein the second supplementary active region portion dimension is greater than a sub-resolution dimension; and wherein a thickness of the portion of the active region and the supplementary active region portion is greater than a critical dimension.

20. The integrated circuit device of claim 18 wherein a thickness of the portion of the active region and the supplementary active region portion is greater than 1.05 times a minimum design rule distance between the contact feature and the isolation feature.

* * * * *